(12) United States Patent
Nanis (10) Patent No.: US 8,197,661 B1
(45) Date of Patent: Jun. 12, 2012

(54) METHOD FOR FABRICATING SPUTTER TARGETS

(76) Inventor: Leonard Nanis, San Jose, CA (US)

( * ) Notice: Subject to any disclaimer, the term of this patent is extended or adjusted under 35 U.S.C. 154(b) by 1214 days.

(21) Appl. No.: 11/945,178

(22) Filed: Nov. 26, 2007

Related U.S. Application Data (60) Division of application No. 10/896,305, and a continuation-in-part of application No. 10/896,305, filed on Jul. 21, 2004, now Pat. No. 7,314,650.

(60) Provisional application No. 60/492,768, filed on Aug. 5, 2003.

(51) Int. Cl.
*C25D 15/00* (2006.01)

(52) U.S. Cl. .......................... 205/109; 205/149

(58) Field of Classification Search .................. 205/109, 205/118, 149, 158
See application file for complete search history.

(56) References Cited

U.S. PATENT DOCUMENTS

| | | | | |
|---|---|---|---|---|
| 2,642,654 A * | 6/1953 | Ahrens | | 428/566 |
| 2,852,463 A * | 9/1958 | Gutzmer | | 204/242 |
| 3,562,000 A | 2/1971 | Parker | | |
| 3,762,882 A * | 10/1973 | Grutza | | 428/615 |
| 3,798,056 A | 3/1974 | Okinaka et al. | | |
| 4,149,132 A | 4/1979 | Richter et al. | | |
| 4,261,802 A * | 4/1981 | Fulop et al. | | 438/92 |
| 4,544,091 A * | 10/1985 | Hidler et al. | | 228/124.1 |
| 4,601,795 A * | 7/1986 | Smith et al. | | 205/109 |
| 4,786,564 A | 11/1988 | Chen et al. | | |
| 4,789,441 A * | 12/1988 | Foster et al. | | 205/50 |
| 5,266,181 A * | 11/1993 | Matsumura et al. | | 205/109 |
| 5,405,646 A | 4/1995 | Nanis | | |
| 5,824,205 A * | 10/1998 | Foster | | 205/109 |
| 5,973,405 A * | 10/1999 | Keukelaar et al. | | 257/780 |
| 6,156,390 A | 12/2000 | Henry et al. | | |
| 6,306,466 B1 | 10/2001 | Feldstein et al. | | |
| 6,309,583 B1 | 10/2001 | Feldstein | | |
| 6,328,927 B1 | 12/2001 | Lo et al. | | |
| 6,342,114 B1 | 1/2002 | Lam et al. | | |
| 6,355,154 B1 * | 3/2002 | Buratti | | 205/109 |
| 6,423,196 B1 | 7/2002 | Ivanvov | | |
| 6,506,509 B1 | 1/2003 | Feldstein et al. | | |
| 6,586,047 B2 | 7/2003 | Durkin et al. | | |
| 6,589,311 B1 | 7/2003 | Han et al. | | |
| 6,619,537 B1 * | 9/2003 | Zhang et al. | | 228/194 |
| 6,627,118 B2 | 9/2003 | Kageyama et al. | | |
| 6,630,203 B2 | 10/2003 | Bahn et al. | | |
| 6,676,728 B2 | 1/2004 | Han et al. | | |
| 6,706,420 B1 | 3/2004 | Kozlov et al. | | |
| 6,709,557 B1 | 3/2004 | Kailasam et al. | | |

(Continued)

OTHER PUBLICATIONS

Vossen et al.(Thin Film Processes, 1978, p. 41-45).*

(Continued)

*Primary Examiner* — Luan Van
(74) *Attorney, Agent, or Firm* — Haynes Beffel & Wolfeld LLP (57) ABSTRACT

A method for fabricating sputter targets is based on electrolytic deposition of metals or metal alloys onto the planar surface of a target backing plate. The target material can be electrolytically deposited onto the backing plate directly, or first electrolytically deposited onto the surface of a thin metal starting sheet which, after plating is complete, is then subsequently solder bonded to a substantially thicker metal backing plate. The disclosed technology includes steps for protecting regions of a target backing plate or starting sheet from deposition, said regions being other than the surface to be coated with target material by means of electrolytic deposition.

26 Claims, 11 Drawing Sheets

U.S. PATENT DOCUMENTS

| | | | |
|---|---|---|---|
| 6,713,391 B2 | 3/2004 | Yi et al. | |
| 7,297,247 B2 * | 11/2007 | Subramani et al. | 205/149 |
| 7,297,868 B2 * | 11/2007 | Bhattacharya | 136/262 |
| 2003/0015432 A1 * | 1/2003 | Li et al. | 205/261 |
| 2005/0279637 A1 * | 12/2005 | Pinter et al. | 205/78 |
| 2007/0039817 A1 * | 2/2007 | Daniels et al. | 204/298.12 |

OTHER PUBLICATIONS

Chapman, B. "Glow Discharge Processes," John Wiley and Sons, NY 1980, ISBN 0-471-07828-X, Chapter 6, pp. 177-194.

Gawrilov, G.G., "Chemical (Electroless) Nickel-Plating," Portcullis Press, England, ISBN 0-86108023-8, 1979, pp. 26-31, 165-167 and 169-175.

Mallory, Glenn O., et al., "Electroless Plating: Fundamentals and Applications," American Electroplaters and Surface Finishers Society, 1990, ISBN 0-936569-07-7, pp. 261-268 (Chapter 10).

Budniok, A., et al., "Advanced Materials Forum I," 2002, ISBN 0-87849-905-9, Proceedings 1st International Materials Symposium, Portugal, Trans Tech Publications Inc., Zurich, 3 pages.

Graham, Kenneth A., "Electroplating Engineering Handbook," ed. Van Nostrand Reinhold, NY, 1962, LC76-129204, Chapter 6, pp. 231-257.

* cited by examiner

METHOD FOR FABRICATING SPUTTER TARGETS

CROSS REFERENCE TO RELATED APPLICATIONS

This application is division, and a continuation-in-part, of U.S. patent application Ser. No. 10/896,305 filed on 21 Jul. 2004, which application was filed under 35 USC-111(a) claiming benefit pursuant to 35 USC-119(c)(1) of the filing date of Provisional Application 60/492,768; filed 5 Aug. 2003, pursuant to 35 USC-111(b), both of which are incorporated herein by reference.

FIELD OF THE INVENTION

The present invention relates to electrolytic plating as a method for the fabrication of targets which serve as the source of metals and alloys for vacuum sputter deposition of said metals and alloys as thin film coatings onto articles of value. The present invention is an alternative to conventional energy and capital intensive target fabrication methods based on powder metallurgy or melt-casting techniques.

BACKGROUND OF THE INVENTION

Sputtering (also known as vacuum sputtering or physical vapor deposition or PVD) is uniquely suited for controlled and reproducible deposition of thin films on an atom layer by atom layer basis. Sputtering is the preferred method for adding the essential magnetic layer to memory disks used in computer disk drives. Sputtering is also used extensively in semiconductor device fabrication. In addition to depositing thin layers of metals, sputtering is also a means for adding thin layers of insulating materials such as aluminum oxide, an important step in the fabrication of write/read heads for disk drives.

Details of the mechanism of sputtering may be found in texts on plasma physics such as "Glow Discharge Processes" by B. Chapman (John Wiley and Sons, NY 1980, ISBN 0-471-07828-X, Chapter 6, pages 177-194). Briefly, sputtering takes place in a vacuum chamber. A small amount of inert argon gas added to the vacuum becomes ionized in an electrical field applied between two electrodes. The electrically accelerated argon atoms impact the source target electrode and knock loose atoms. The loosened target atoms are ejected and transfer through the vacuum space and build up a desired layer on an opposing electrode surface.

The physical arrangement of a target and its backing plate is illustrated in FIGS. 1A, 1B, 1C and 1D for circular targets of the type designed for the widely-used Perkin-Elmer type 2400 and 4400 sputter systems. However, the key features are also common to target assemblies for other systems.

Figure 1A:
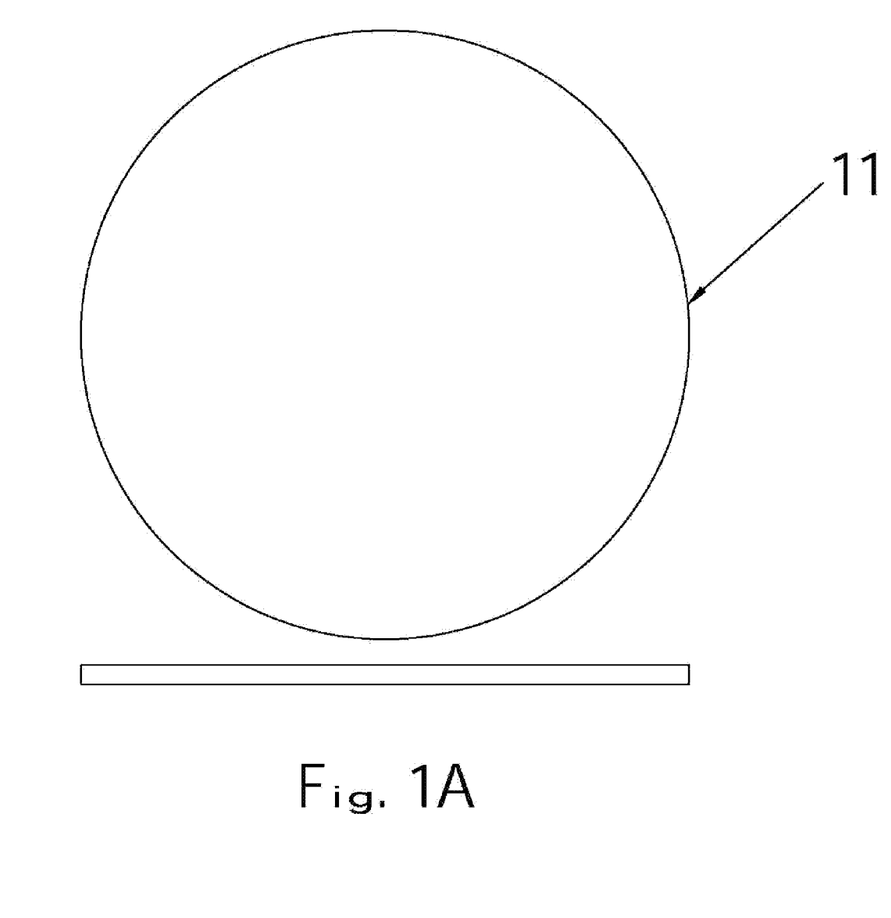
FIG. 1A is a top and side view of a circular target before attachment to a backing plate by means of conventional soldering.
Figure 1B:
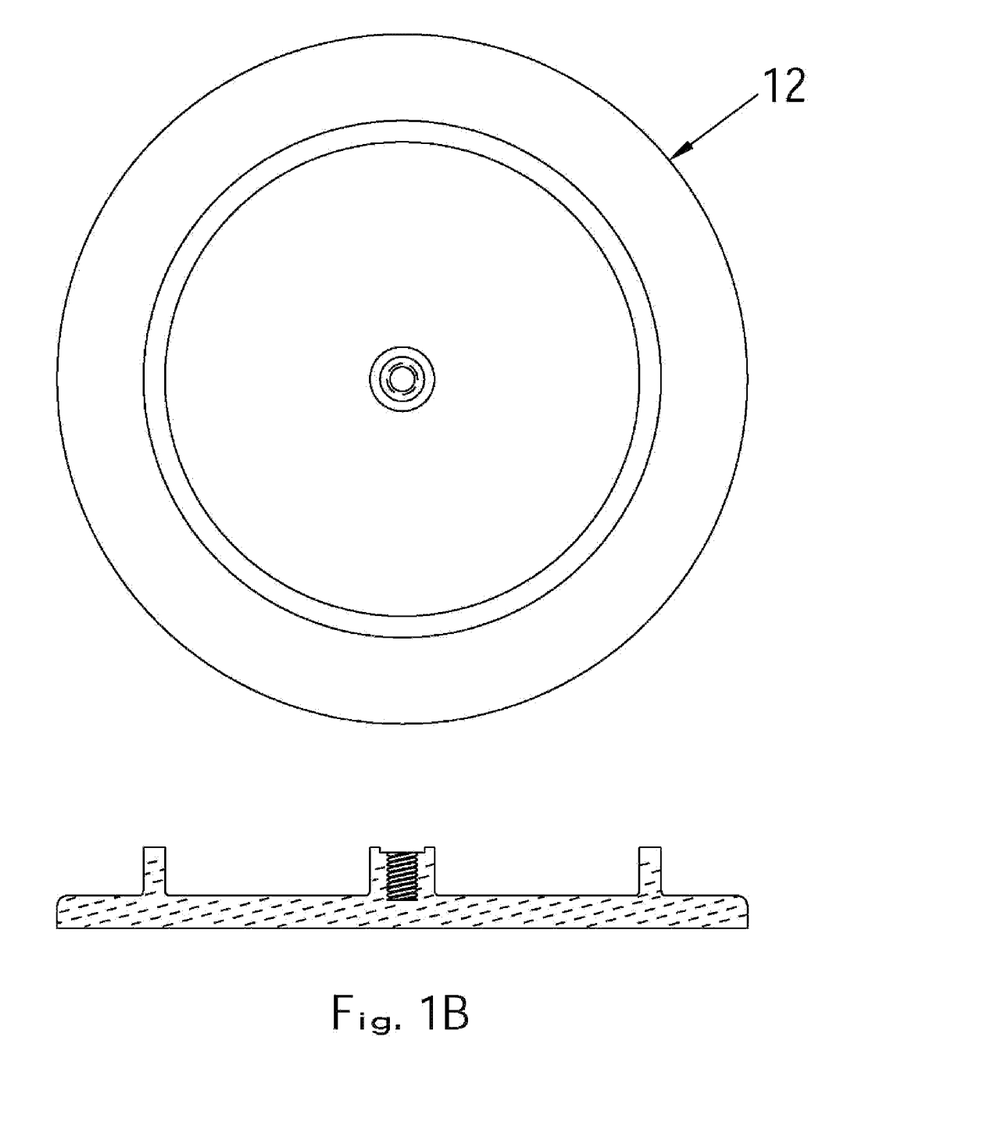
FIG. 1B is a top and side view of a backing plate, typically made of oxygen-free high-conductivity (OFHC) copper.
Figure 1C:
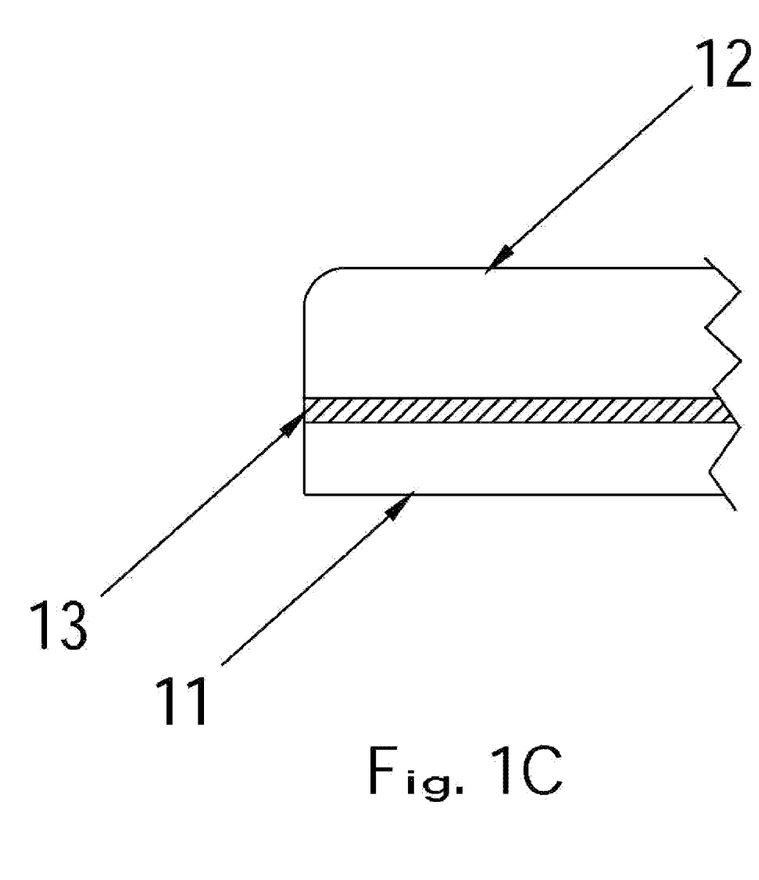
FIG. 1C is a schematic view of target material (11) after conventional bonding to backing plate (12) by a thin layer of solder (13), scale enlarged for clarity.

Typically, the material of the source target (11) is a 3 to 6 mm thick layer (FIG. 1A) which is bonded to a reusable copper backing plate, (12), FIG. 1B, by a low melting solder layer (13), shown enlarged for clarity in FIG. 1C. In addition to source targets, the basic components of a sputtering system are the enclosing vacuum chamber, pumps to maintain vacuum in the chamber, argon gas control, water cooling for targets and high voltage power supply.

Figure 1D:
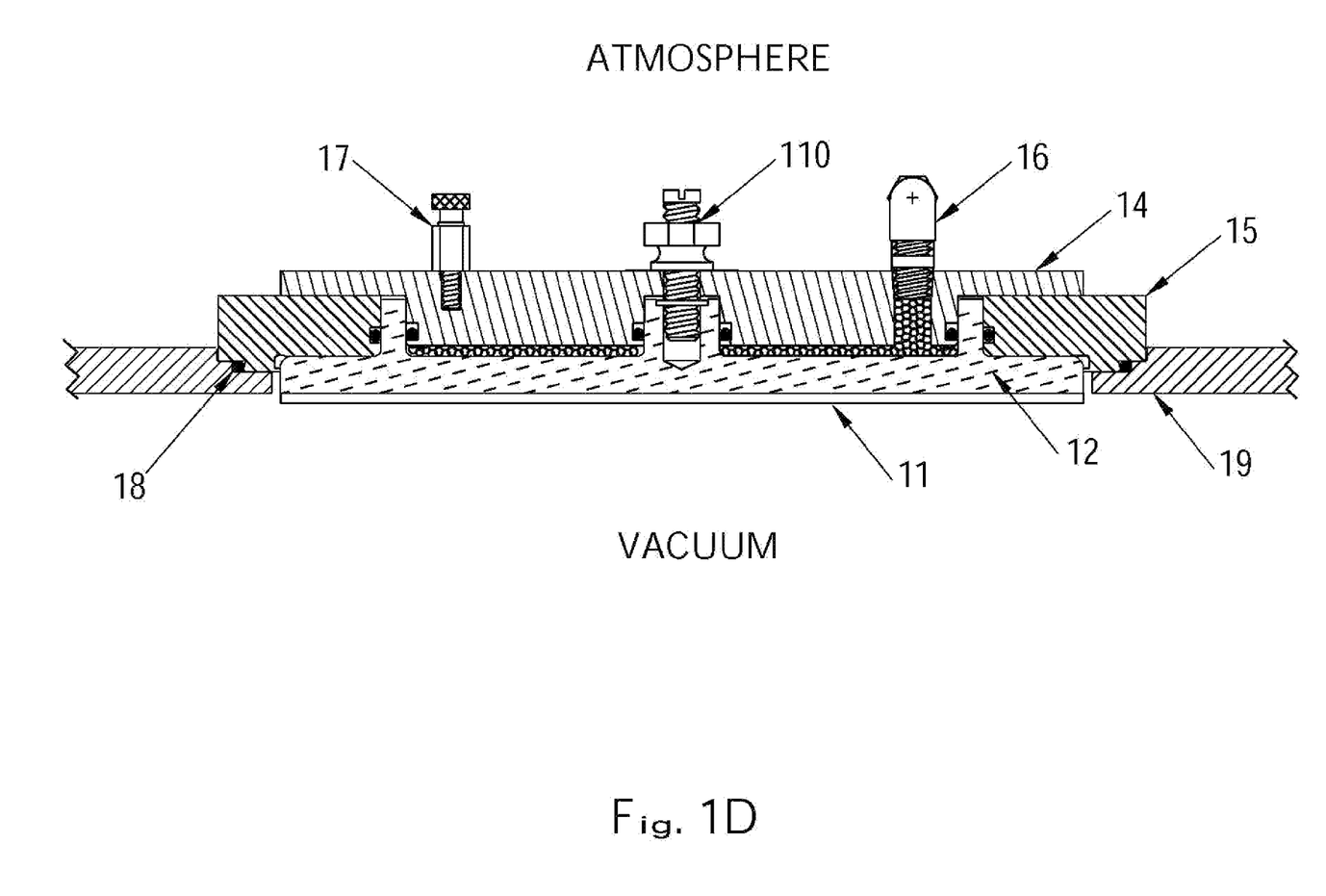
FIG. 1D shows the bonded target-backing plate assembly positioned for operation in the sputter process vacuum chamber.

FIG. 1D shows a bonded target-backing plate assembly in position for sputtering. The assembly fits into a circular opening in the wall of the sputter process vacuum chamber and essentially becomes part of the vacuum chamber wall, with the target (11) front surface in vacuum. The internally threaded boss protruding from the center of the reverse side of backing plate (12) serves to engage bolt (110) for clamping cover plate (14) to the backing plate. The circular ring boss on the reverse side of backing plate (12) provides a seat for elastomer O-rings seals for cooling water and also vacuum. For clarity, only vacuum seal O-ring (18), compressed between insulator (15) and chamber wall (19), is labeled.

Cover plate (14) is drawn tightly against the rear side of backing plate (12) with the aid of threaded bolt/nut (110). A space between cover plate (14) and the rear of backing plate (12) defines a channel for flow of cooling water which enters the gap through fitting (16) and exits through a similar fitting, not shown. A circular insulating ceramic ring (15) is positioned at the outer portion of the rear of backing plate (12), interposed between the backing plate and cover plate (14) and provides electrical isolation between the wall of the vacuum chamber (19) and the target-backing plate-cover plate assembly. High voltage connection to the target assembly is made through terminal (17).

DESCRIPTION OF RELATED ART

Sputter targets of metal and metal alloys are conventionally fabricated by two major methods:
1) pure metal or alloy melting, ingot casting, and subsequent rolling, shaping and machining to final form (11), and
2) powder metallurgical methods such as hot-pressing or sintering of a pure metal powder or mixture of powders of desired alloy component and machining to final form (11).

Targets (11) are conventionally solder-bonded to a backing plate, as mentioned above.

In a variant of method 1, alloys may also be sputtered from a target comprised of a mechanically assembled mosaic array of pure constituent metals inlaid in a matrix, as described by Kailasam et al., U.S. Pat. No. 6,709,557.

SUMMARY OF THE INVENTION

The present invention is a new approach to target fabrication whereby the target material is built up by electrolytic deposition (also known as plating or electrodeposition) from a solution containing metal dissolved as ions. The present invention is thus a novel third method, different from the two main methods of target fabrication now in use, namely said melt casting and powder metallurgy.

In the present invention, typical of electrodeposition systems, a current of electrons is sent by a direct current (DC) power supply to the interface between a conducting cathode and an electrolytic solution. At the cathode surface, the arriving electrons cause positively charged metal ions in the immediately adjacent electrolytic solution to be neutralized and deposited on the cathode as solid metal. Direct current flowing in the plating circuit to the cathode-electrolyte interface can controllably deposit dense solid metal at a predictable rate until a specified target thickness is attained.

Electrodeposition of target material may be made directly onto a conventional copper backing plate. As plating begins, a firmly adherent bond is formed at the junction between the copper backing plate and the initial layers of deposited target, thereby assuring low electrical resistance and low thermal resistance over the entire bonded surface. Cooling by a flow of liquid coolant externally supplied to the backing plate removes heat generated by the sputtering process. The present invention permits high power densities by providing good heat transfer from the target and backing plate without the use of a conventional low-melting solder bond at the target-backing plate interface. The adherent and full coverage bond between electro-deposited target and backing plate avoids the formation of hot spots and undesirable melting, as may happen at gaps in a conventional solder layer when sputtering power is applied.

In an alternative related embodiment, target material may first be electrodeposited onto a relatively thin sheet substrate, preferably comprised of copper, rather than directly onto a backing plate, as described above. In the alternative embodiment, only the thin sheet substrate is immersed in a plating solution to serve as a cathodic starting surface for the target deposit. The first deposited layers adhere tightly to the cathodic surface, thus firmly attaching the completed deposit to the starting sheet. After plating is complete, the combined plated target plus starting sheet may then be attached to a backing plate by means of conventional solder bonding. The unplated back of the starting sheet provides a solderable surface.

According to the present invention, sputter targets may be manufactured by electrolytic deposition of metal or co-deposited metal alloys onto either a backing plate or an intermediate starting sheet. The technological scope of the present invention may be further extended by composite deposition. Composite alloys may be formed in a matrix of electrodeposited metal by co-depositing finely divided solid materials suspended in the plating bath. The growing metal matrix incorporates and completely encapsulates the particulate material and forms a multi-phase alloy. Particulate material co-deposited in an electrodeposited matrix metal may be metallic or non-metallic. The incorporation of metal particles within a metal matrix provides a means to form a target with the overall composition of a multi-component metal alloy without first requiring the melting together of the component metals. Composite targets may be formed in a similar manner where the plated matrix encapsulates particles of non-conducting materials such as aluminum oxide, diamond or silicon carbide.

Co-deposited targets may also be comprised of matrix metal with incorporated compounds to form an overall composition which is difficult or impossible to form by melting. One such practical application relates to thin film photovoltaic material such as CIGS, a copper-indium-gallium diselenide, which may be formed into a sputter target comprised of matrix copper with co-deposited particulate indium selenide, gallium selenide, and selenium. Following sputtering, heat treatment of as-sputtered material may be useful for inducing crystallite growth. Co-deposited particulate material should preferably be insoluble and non-reactive while suspended in the plating bath so as not to change the electrochemical nature of the bath or generate undesirable by-products.

A sputtering target with an average composition determined by the concentration of particulate materials co-deposited in a matrix metal will yield a sputtered product with the same average composition. Each increment of area on the target surface ejects activated atoms essentially in all directions so that each part of the sputtered deposit gains the average composition of the target surface. Accordingly, an alloy deposit is obtained by sputtering from a completely mixed pre-melted and cast alloy target, or from sintered powders with the same overall alloy composition, or from electrochemically co-deposited composite particulates in a metal matrix with the same overall composition.

The source areas on the target surface for each component of the alloy may range widely in size, from individual atoms to macroscopic regions. At the atomic scale, metals that comprise the overall alloy composition may be intimately mixed in a substitutional or interstitial crystal lattice structure. On a larger scale, atoms may be sputtered from a source area which is a microscopic particle of pure metal or pre-alloyed metal which has been co-deposited and embedded in a matrix metal, which itself also acts as a source area of the target. An example of very large scale source area is the "checkerboard" array of macro-size tile segments of individual metal components in the target structure described by Kailasam et al. (U.S. Pat. No. 6,709,557) for depositing an alloy.

The energy and capital equipment requirements for the present invention are of relatively low cost in comparison with the presses and sintering furnaces for the powder method and likewise for melting furnaces for ingot casting. For the present invention, key pieces of equipment are standard plating shop items and include direct current power supplies and relatively inexpensive tanks constructed of polymer materials, such as polypropylene, for containing plating baths, with associated pumps for fluid circulation and filtration plus heaters and controls, where appropriate. The essential features of a plating system are shown schematically in FIG. 4. Aqueous solutions are the most commonly used plating baths but the intent of this invention may also be achieved in non-aqueous or molten salt electrolytes, with due attention to selection of materials for container and piping and also the growth behavior of the deposit.

GENERAL FEATURES OF THE INVENTION

In an embodiment for plating target material directly onto the planar surface of target backing plate (12), portions of the backing plate other than for the desired deposit are isolated from the electrolytic deposition process. Areas to remain non-plated can first be coated with commercially available non-conducting paint ("platers stop-off").

Figure 2A:
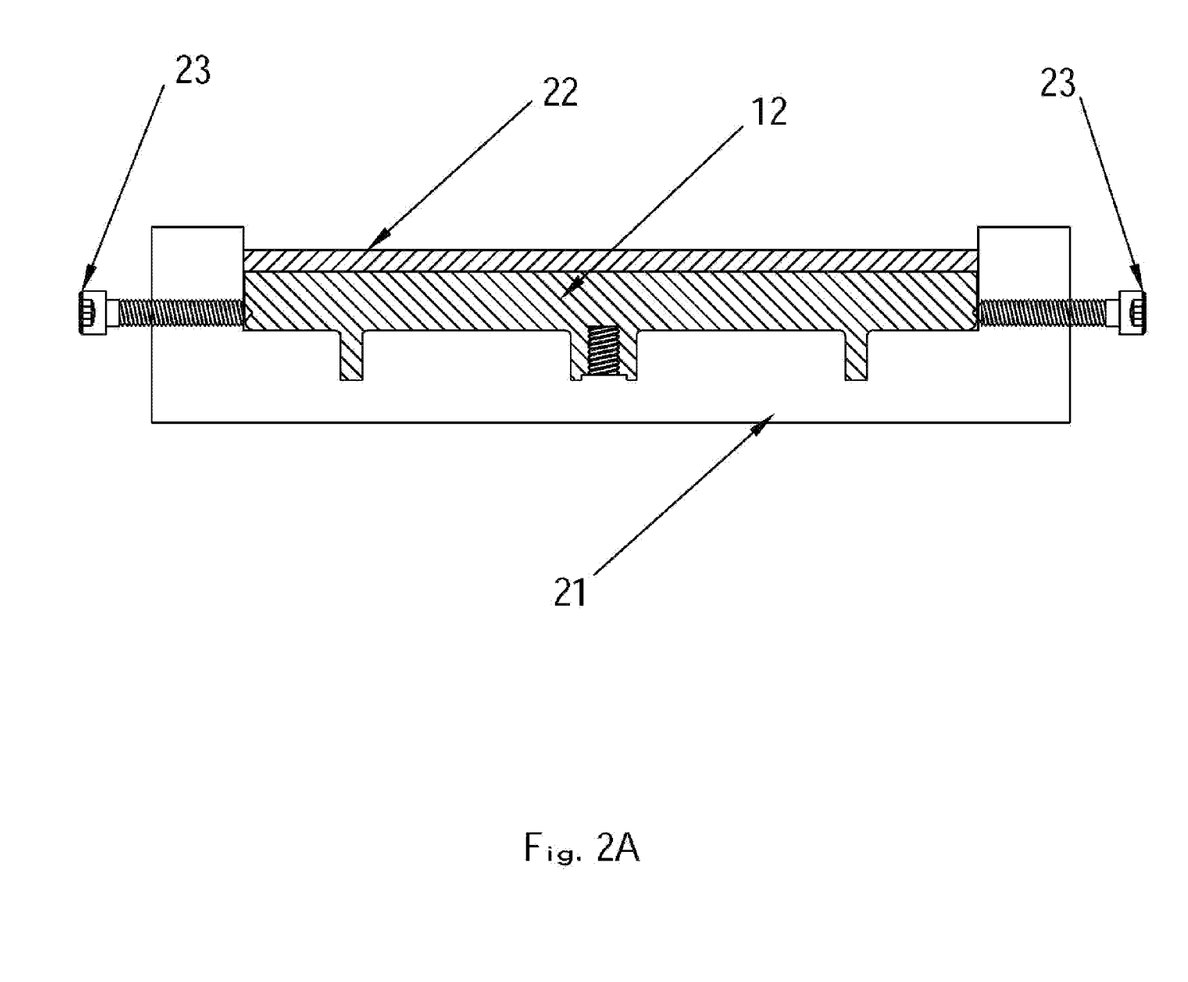
FIG. 2A is a schematic cross-section drawing of an insulating polymer fixture (21) for holding backing plate (12) in position for electrodeposition of target material (22).

In a preferred embodiment, backing plate (12) can also be held in non-conducting polymer fixtures designed to present only the surface to be plated to the plating solution, as shown in FIG. 2A.

In a more preferred embodiment, a coat of insulating paint is also used to provide extra assurance of electrical isolation for all but the front surface of backing plate (12) held in polymer fixture (21). Set screws (23) serve to hold the backing plate firmly in place and also to conduct current to the backing plate. Electrical current contacts and other metal components immersed in the plating bath may also be coated with insulating paint so that all current is directed to the growing surface of the target material, (22) in FIG. 2A). Target deposit (22) is prevented from sideways growth by the inner wall of the cavity in polymer fixture (21).

As an alternative to plating directly onto a backing plate, target material may first be electrodeposited onto a thin starting sheet which is then attached to a backing plate by soldering in the conventional manner. The rear surface of starting sheet (24), shown in FIG. 2B without deposit (22) and in FIG. 2C with deposit (22), may also be pre-coated with insulating paint before being positioned for plating, held in place by clamps (26) and set screw (27), which also conducts current to the backing plate. The target deposit (22) is prevented from sideways growth by the inner wall of the cavity in polymer fixture (25). Electrical current contacts and other metal components immersed (27) in the plating bath may also be coated with insulating paint so that all current is directed to the growing surface of the target material, (22) in FIG. 2C. Any areas at the outer region of starting sheet (24) that remain unplated due to shielding by clamp (26) may be trimmed before soldering to a backing plate.

The general practice of metal plating follows preparation steps of surface cleaning with etch solutions before plating current is applied. Etch solutions and subsequent rinses in clean water are selected to assure that a part to be plated is clean and oxide-free in order to promote good bonding and adhesion between the deposited metal and the substrate. This tight plated bond provides good thermal and electrical contact between the target material and the backing plate or starting sheet without the use of low-melting indium alloy solder.

Figure 5:
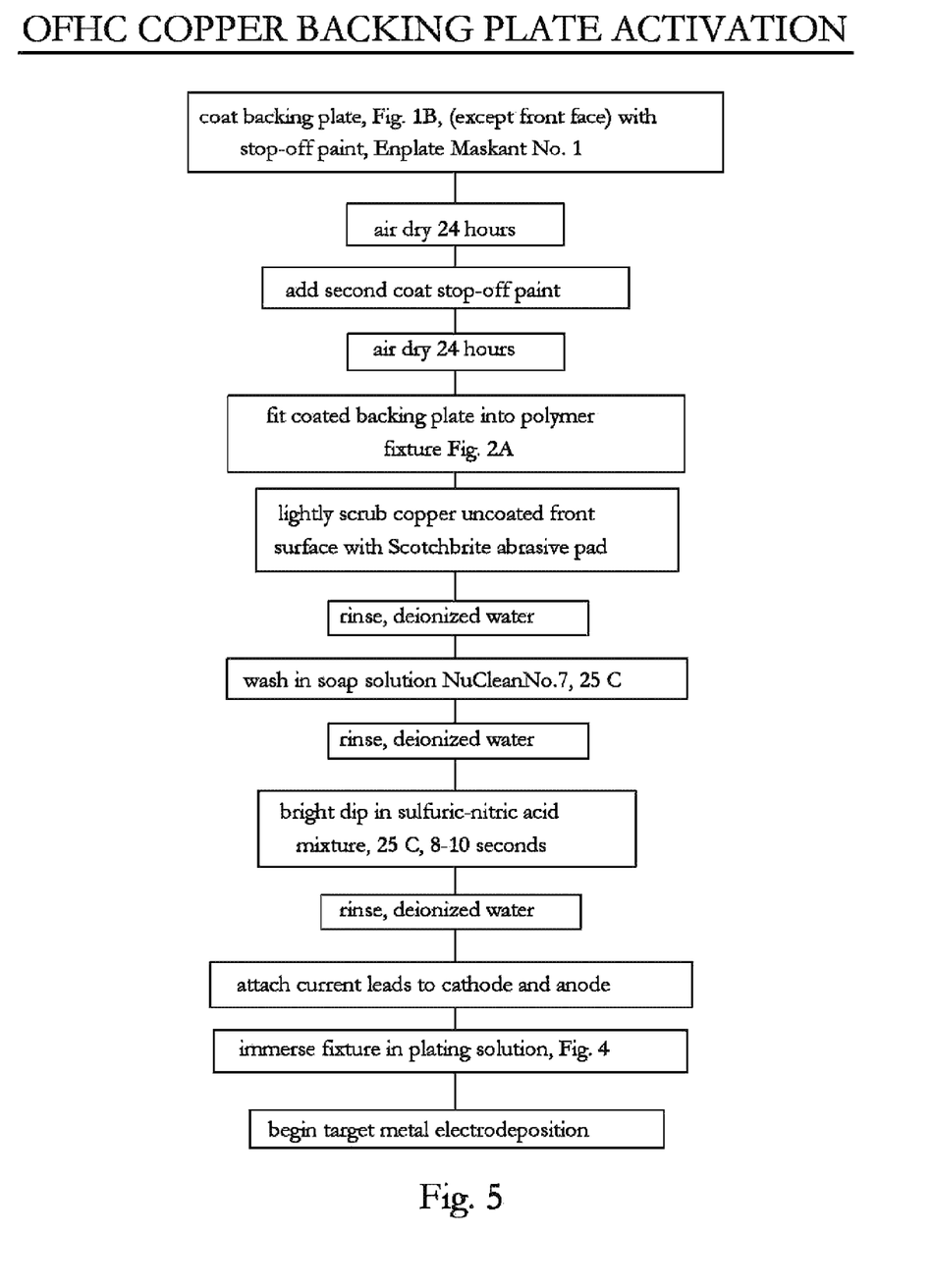
FIG. 5 is a flow chart for preparation of a copper backing plate or starting sheet for electrodeposition of target material.

We have found that good adhesion of electroplated metal such as nickel to a backing plate typically comprised of oxygen free high conductivity (OFHC) copper may be obtained by following the preparation steps outlined in Table 1 and FIG. 5.

TABLE 1

Figure 4:
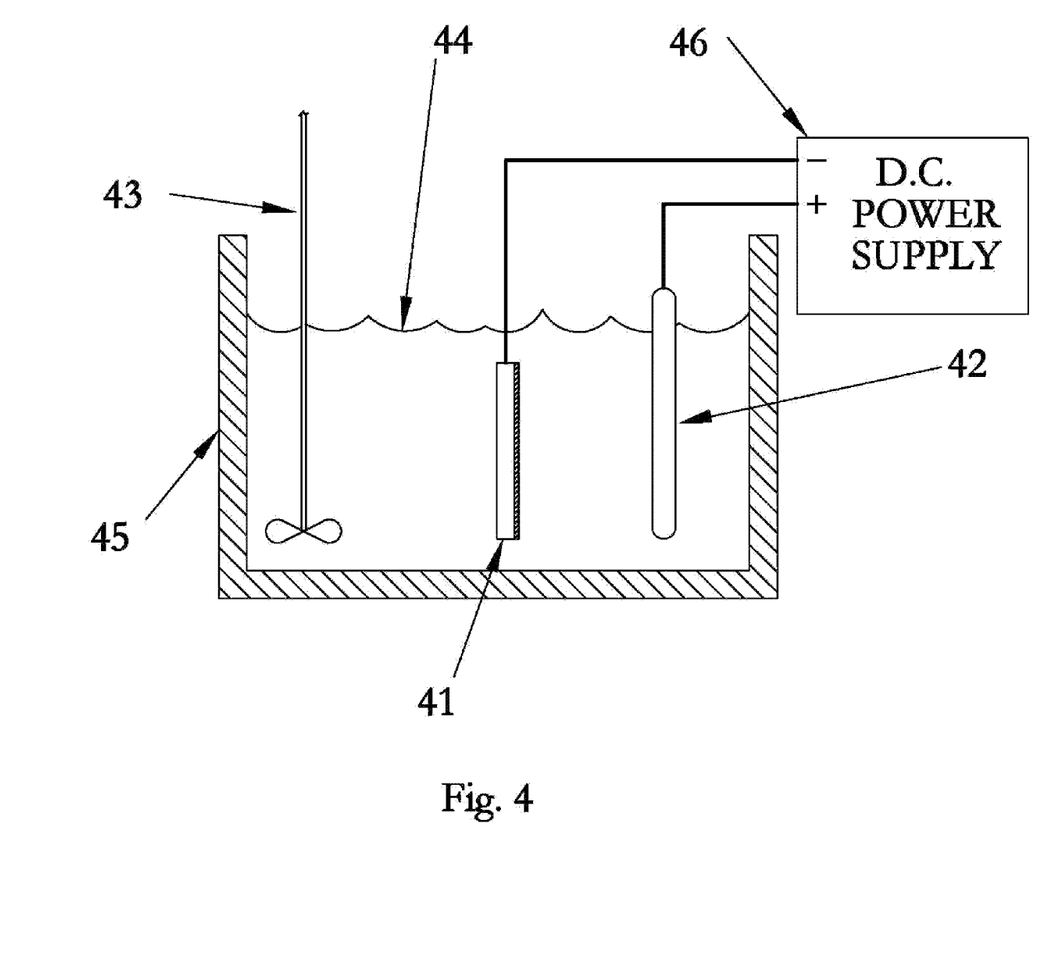
FIG. 4 shows schematically the essential features of a plating system.

OFHC Copper Backing Plate Activation 1) coat backing plate (except front face) with stop-off paint, (Enthone Enplate Maskant No. 1)
2) air-dry 24 hours
3) add second coat stop-off paint
4) air-dry 24 hours
5) fit coated base plate into polymer fixture, FIG. 2A
6) lightly scrub copper uncoated front surface with Scotchbrite abrasive pad
7) rinse, deionized water
8) wash in soap solution, NuClean No. 7 at 25° C.
9) rinse, deionized water
10) bright dip in sulfuric-nitric acid mixture, 8-10 seconds
11) rinse, deionized water TABLE 1-continued OFHC Copper Backing Plate Activation 12) attach cathode (41) current leads to backing plate-polymer fixture assembly, FIG. 2A and anode leads to (42)
13) immerse in plating bath, FIG. 4
14) begin target metal electrodeposition In a preferred embodiment, referring to the schematic cross-sectional view in FIG. 2A, the insulating maskant paint coated OFHC copper backing plate (12) may be secured in polymer fixture (21) for cleaning by all steps of surface preparation (Table 1, FIG. 5) and subsequent plating of target material (22). Selected areas on the side of backing plate (12) may remain uncoated to assure good electrical contact with current carrying set screws (23).

Figure 2B:
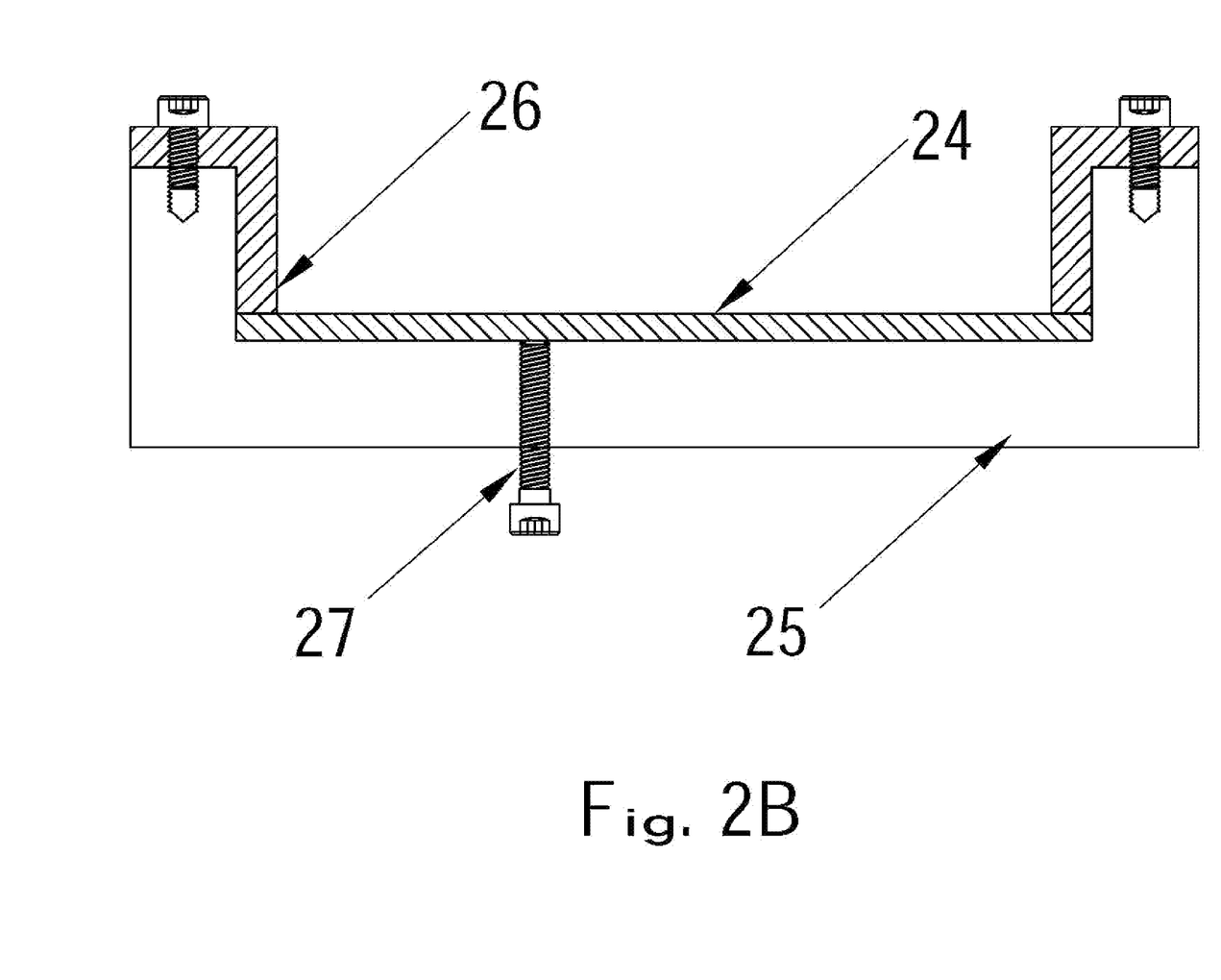
FIG. 2B is a schematic cross-section of an insulating polymer fixture (25) for plating target material (not shown) onto a thin metallic starting sheet (24)

For plating target material on a thin starting sheet, a preferred method for cleaning is to hold the starting sheet in the polymer fixture with clamps (26), as shown in FIG. 2B. The rear face of the sheet may be pre-coated with maskant for isolation from the cleaning chemistry as well as from the subsequent plating bath and deposition current. For a copper starting sheet, the cleaning steps are the same as for the copper backing plate described in Table 1 and FIG. 5.

Those skilled in the art of plating will recognize that thermally and electrically conductive metals other than copper may be used as a starting sheet. If necessary, the rear face of the starting sheet may first be coated with a very thin layer of copper or other readily solderable metal before maskant is applied to assist subsequent solder bonding to a copper backing plate when the maskant is stripped off after target plating is complete. The pre-coating of the rear face of the starting sheet may be accomplished by various means such as sputtering or electroplating. For electroplating, the reversed starting sheet may be held in the fixture shown in FIG. 2B for surface preparation steps and plating conditions appropriately selected for an alternative metal starting sheet.

Electrodeposition rate of target metal (22) is controlled by the current from power supply (46), FIG. 4. The deposit thickness achieved is controlled both by current and the time of current passage. Additional control of the plated deposit is obtained by adjustment of the plating bath (44) composition, and of the temperature of the bath. For clarity, heaters, controls and filtration equipment are omitted from FIG. 4

Figure 2C:
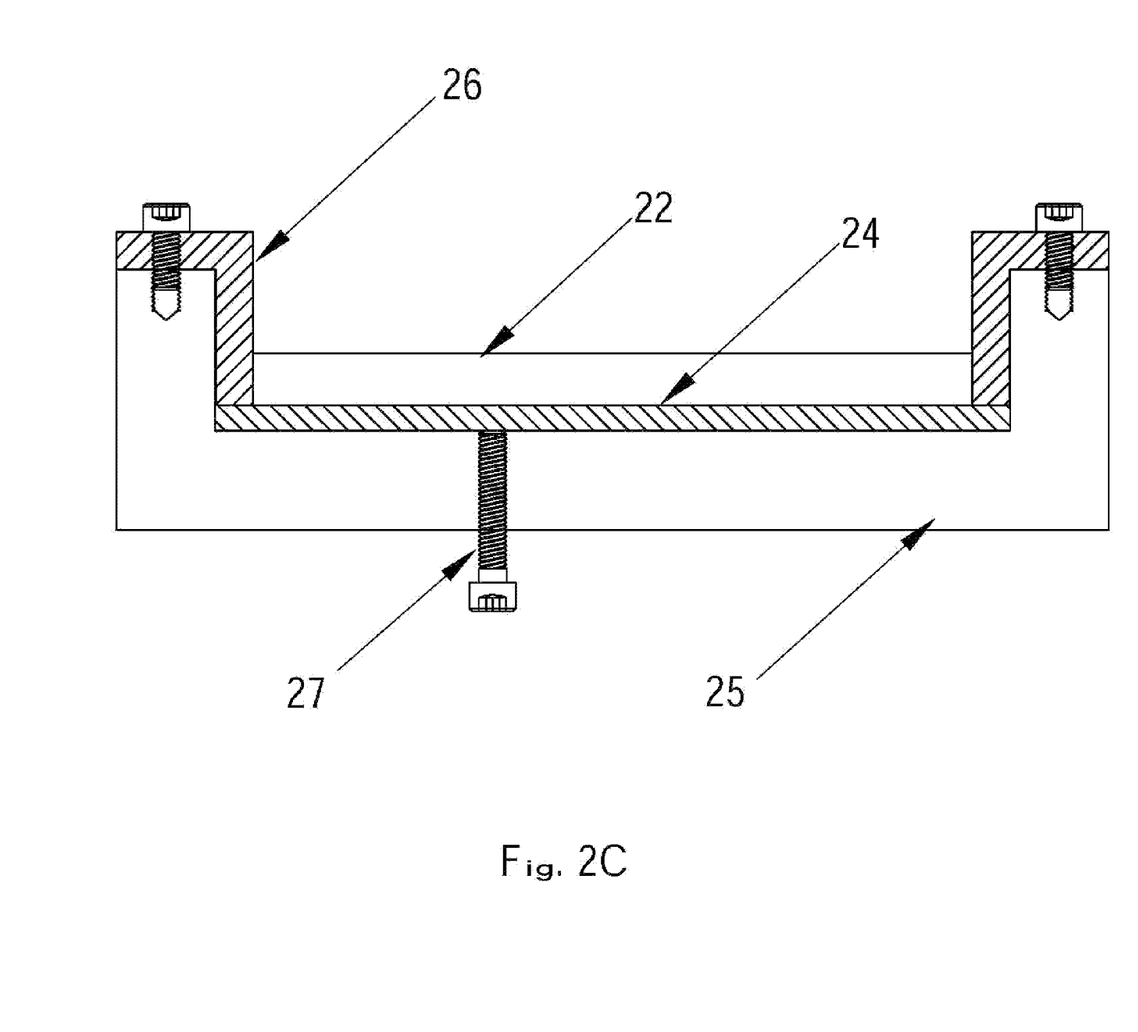
FIG. 2C is a schematic cross-section similar to FIG. 2B, showing target material (22) electrodeposited on starting sheet (24).

Stirring (43) of bath (44) in tank (45) shown in FIG. 4 increases convective mass transport of metal ions to the growing electrode surface for cathodic reduction to solid metal, location (22) in FIGS. 2A and 2C. Cathode fixture (41) is a simplified schematic representation of both backing plate polymer holder shown in detail in FIG. 2A and also the starting sheet holder shown in FIGS. 2B and 2C.

Several targets of the same or different shape and area may be grown simultaneously in a single plating tank. Where possible, anodes of the same material may serve as the source to replace metal removed from solution by the electrodeposition process. Those skilled in the art of electroplating will give due attention to the placement of anodes in order to provide uniform current distribution on a growing single cathode target or on multiple cathode targets wired electrically in parallel.

Calculated rates of electrodeposition for practically achievable current densities on a conventional circular copper backing plate with 8 inch (20.3 cm) diameter are shown in Table 2 in terms of time to achieve a final plated thickness of 6 mm (0.24 inch), assuming continuous 24 hour per day plating.

TABLE 2

Time to electrodeposit 6 mm thick metal
on 8 inch diameter copper backing plate

| METAL | Days (24 hour) of deposition at current density (mA/sq. cm) of | |
|---|---|---|
| | 50 | 100 |
| Nickel | 12 | 6 |
| Gold | 11 | 6 |
| Rhodium | 19 | 9 |

Electrodeposition of typical target metal requires continuous current passage for a period of one to two weeks, according to the calculations based on Faraday's Law shown in Table 2. With increased current densities permitted by enhanced stirring and mass transport, the time required to attain a 6 mm deposit thickness can be reduced proportionately. Although typical electroplated layer thicknesses applied in the metal finishing industry are usually less than about 0.001 inch (25 micron), there is, however, no fundamental limit to the thickness of deposit which may be grown.

From the times shown in Table 2, electrodeposition of targets may be considered as a slow process. However, for a fair comparison with conventional methods of target manufacture, it is noted that for powder methods, gradual heating, compression, sintering and cooling stages for a single die can take 24 hours or more. Fabrication of targets by ingot melting and casting also requires time consuming steps, particularly machining to final shape, with attendant scrap loss. Solder bonding of a target to a copper backing plate may also require several steps of coating to assure good adhesion of solder to the target material.

Once plating has started, further deposition requires minimal operator attention. While continuous operation is desirable, if there is any non-uniform deposition such as build up at edges, plating may be interrupted at any time and the part removed from the tank for inspection, followed by leveling of high spots by machining or grinding. The part may then be replaced in the plating tank to restart continued deposition, after steps best suited chemically for cleaning the surface of the particular target material. The circumferential wall of the polymer holder cavities shown in FIGS. 2A and 2B will constrain electrodeposited metal from growing non-uniformly as can otherwise happen at the free edge of a cathode immersed in a plating bath.

For certain applications, a full 6 mm thickness is not necessary. For example, for research and development, a target less than 6 mm thick may suffice. For precious metals, thin targets may be desirable in order to minimize inventory. With the present invention, electrodeposition may be interrupted at any stage of growth to provide a target thickness of choice.

Full 100 percent utilization of target material is never achieved, particularly for high-rate DC magnetron sputtering. Usually, magnetron sputter target wear is non-uniform, being concentrated in a track determined by the shape of the argon plasma produced by strong magnets located behind the target. Targets are removed from service when the eroded wear track deepens, well before a copper backing plate becomes exposed. The lifetime of a target should be sufficient for high volume production without frequent changes to avoid down time for the sputtering system.

The present invention offers a means to readily renew a worn target by electrodepositing new target material to fill in the wear groove. The worn target, removed from service, may be selectively shielded by coating the surface with insulating maskant paint so that only the wear groove remains uncoated. The said coated target may be returned to the plating solution for selective electrodeposition of target metal into the eroded wear track. The deepest part of the wear track may be filled first, followed by stripping of maskant from the shielded areas and further plating for overall restoration of target thickness.

The present invention offers a means to obtain greater total target utilization when the location of the wear pattern is known in advance. The expected high wear region can be initially selectively plated with a thicker than average deposit by strategic placement of masking materials to allow deposition only on the expected high wear region This is a distinct advantage compared with the practice of defining a thicker than average high wear region by subtractively machining away target material from adjacent areas.

A multiplicity of electroplating baths are known which can be adapted for the purpose of this invention. The types of deposits which can be grown to form sputter targets are illustrated by selected examples of pure metals and metal alloys without loss of generality. Persons skilled in the art of electroplating will recognize that commonly used techniques may be advantageously applied within the scope and intent of the present invention. Such techniques may include, but are not limited to, pulsed direct current plating, pulsed plating with reverse anodic component, high velocity jets of recirculated plating solution directed at the growing surface to increase mass transport and current density, ultrasonic vibration in the plating bath to increase mass transport and the like. Also to be included are trace additives to a plating bath for reducing stress in the deposit or reducing grain size in the deposit structure. Such additives, if incorporated in the deposited target, should not negatively affect the properties of the sputtered material.

PREFERRED EMBODIMENTS OF THE INVENTION

Plating baths used by the metal finishing industry may be readily adapted for the purpose of this invention, namely to grow sputter targets with thicknesses substantially greater than the conventional thin deposits added to impart hardness or corrosion resistance to the surface of an underlying metal. Said thin plated layers range typically from about 10 micro-inch to 0.001 inch.

Electrolytic solutions for electroplating pure metals are commercially available, including, but not limited to, gold, rhodium, nickel, iron, copper, and silver. For pure metals such as nickel, copper and silver that are already available in sheet form and which can be solder-bonded to a copper backing plate, there may be less incentive to apply the present invention. An exception may be to reduce precious metal inventory by plating thin targets. Although pure chromium targets are usually melted, cast and machined to final shape, a chromium target can also be plated from aqueous solution with, however, less than 100 percent current efficiency. Post-plate heat treatment of chromium may also be required to reduce stress and remove co-deposited hydrogen.

As plating proceeds, the bath composition may be held essentially constant by electrochemical dissolution of an anode of the same metal. Alternatively, where an inert insoluble anode is used, as in gold plating, metal salts are added to the bath to replenish metal ions depleted by cathodic reduction at the growing target. In general, standard routine analysis of bath chemistry plus additions to adjust bath composition will help to insure constant plating conditions.

To produce electrodeposited metal alloy targets, plateable metals, including said pure metals, can be deposited with a second (or multiple) co-deposited metal element to form an alloy. Target compositions may be obtained by simply dissolving and mixing metal salts in a plating solution from which the metals are then co-deposited to form alloys. The separate component metals are thus alloyed together without melting. In this manner, alloys may be made which are otherwise difficult to fabricate either by alloy melting or by powder metallurgy methods.

Alloying by co-deposition can be achieved in at least two ways. In a first method, two or more metal salts can be dissolved and pre-mixed in the plating bath, as mentioned above. In a second method, an electrodeposited metal or alloy can serve as a matrix for solid particles which become incorporated in the growing electrodeposit, said particles being initially mixed into the plating bath and suspended by continuous stirring of the bath.

In the first said method of solution mixing, alloy targets may be prepared by dissolving metal-bearing chemicals in an aqueous or non-aqueous solution to form the plating bath. The concentration of each metal in solution can be selected so that cathodic co-deposition of each component metal yields a solid alloy of desired composition. As examples, specifications for plating alloys of zinc-nickel, tin-nickel and tin-copper are described by Graham (A. K. Graham, Electroplating Engineering Handbook, van Nostrand Reinhold, NY, 1962, LC 76-129204, page 251).

For co-deposition of alloys, multiple anodes ((42) in FIG. 4) may be comprised of each metal constituent in the alloy or may be inert insoluble anodes used with appropriate make-up of metal ions to replenish metal depleted from the plating bath as deposition proceeds. Co-deposition may take place at cathodic potential far from zero-current equilibrium potentials, resulting in the formation of useful non-equilibrium alloy compositions.

The first said method for alloying by pre-mixing metal salts as bath constituents also applies to solutions for co-deposition of non-metal elements such as phosphorous or boron. In addition to metal ions, ionic species in solution may also receive electrons for reduction at a cathode surface to provide a non-metal which co-deposits in the growing alloy. As an example, Maryak (U.S. Pat. No. 6,099,624) describes the electrolytic deposition at 20 to 50 C of 7 micron thick nickel-phosphorus alloy wear and corrosion resistant coatings with up to 25 weight percent phosphorus. The plating bath contained phosphorous acid mixed with a water solution of nickel alkane sulfonate. Both soluble and insoluble anodes were used simultaneously. A deposition rate of 25 micron (0.001 inch) per hour was attained with good stirring.

Another example of electrolytically formed binary alloy combining a metal and non-metal is cathodically deposited iron-phosphorous wear resistant coatings, as described by Meyer et al. in U.S. Pat. No. 7,138,043. Plating rates as high as 200 milliAmp per square cm were possible with a ferrous chloride bath plus orthophosphite or hypophosphite ions operated at 60 C with good stirring.

An example of an electrolytically plated ternary alloy is the combination of iron, nickel and phosphorus from a bath of metal sulfamates plus phosphorus acid as described by Kim et al. in U.S. Pat. No. 6,824,668.

Figure 3A:
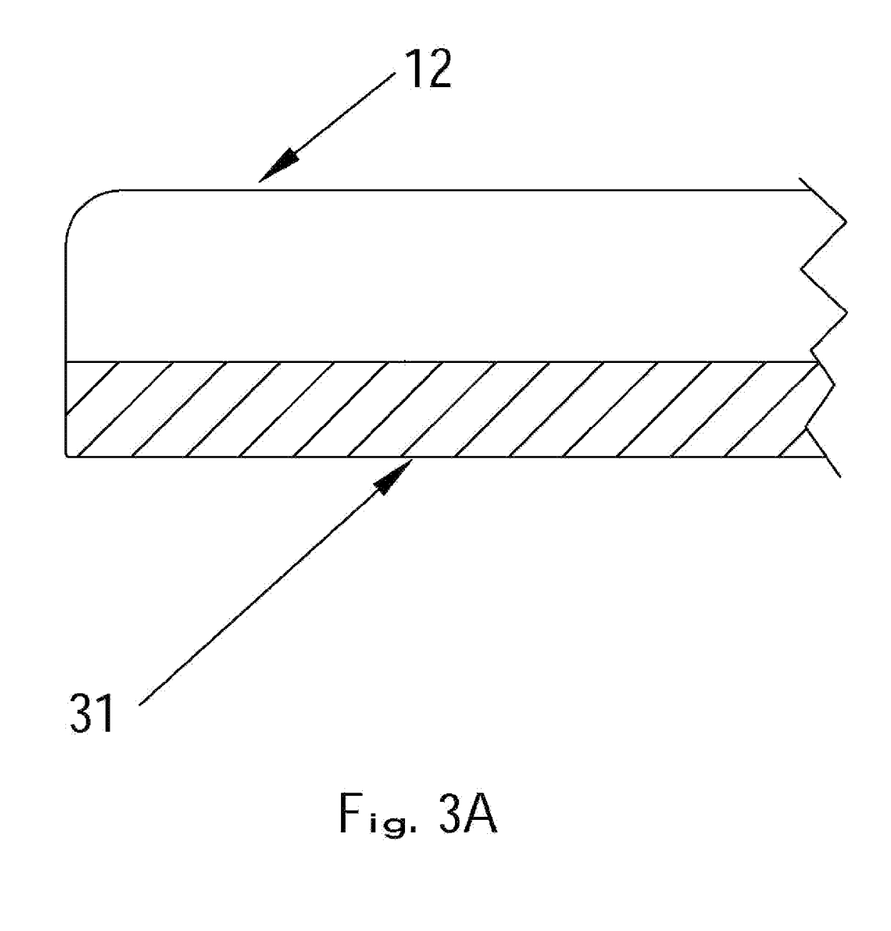
FIG. 3A is a schematic cross-section illustration of a backing plate (12) with directly bonded electrolytically deposited target material (31).
Figure 3B:
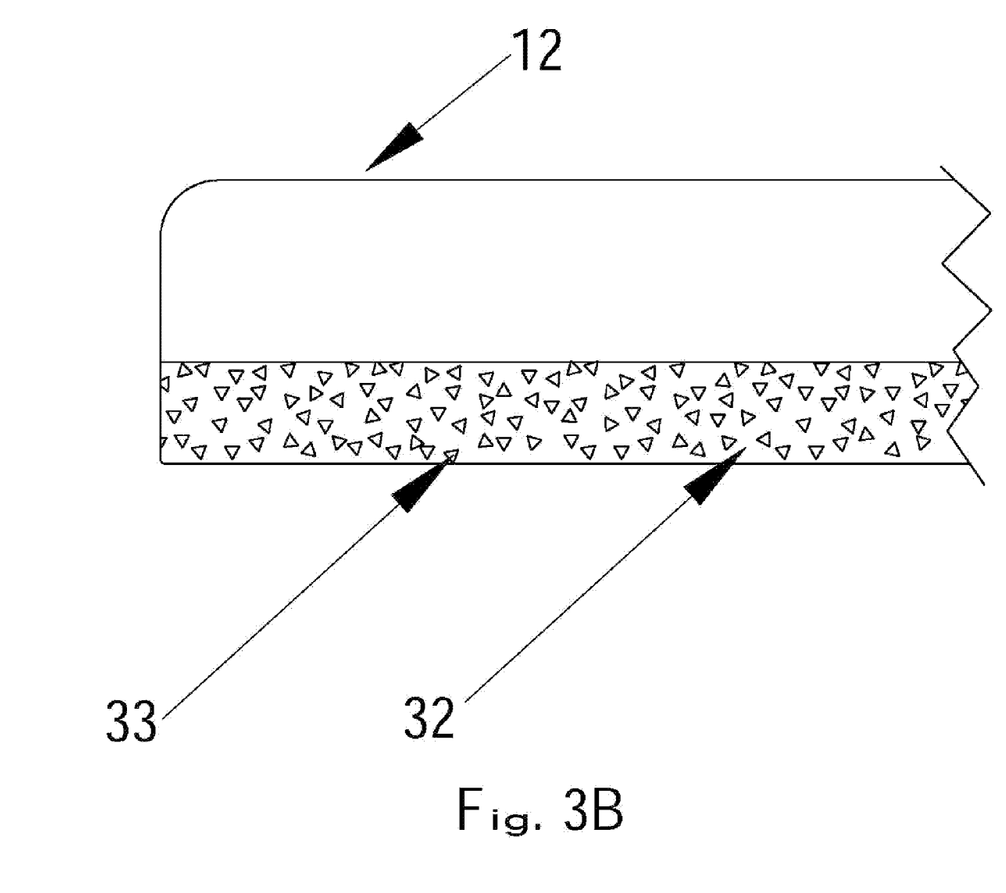
FIG. 3B is a schematic cross-section illustration of a backing plate (12) with electrolytically deposited target material comprised of matrix metal (32) and co-deposited particulate material (33).

In the second said method, alloy targets may also be prepared by depositing a matrix metal in the presence of finely-divided particulate materials suspended in the plating solution. The particles become incorporated throughout the electrodeposited matrix metal (32), as represented schematically by the single particle labeled (33) in FIG. 3B. The size of particles represented in FIG. 3B is not to scale since co-deposited particles typically may range in size from 0.01 to 100 micron.

The exact mechanism of incorporation of co-deposited particles is not well understood in a theoretical sense and is presently an ongoing subject of electrochemical research. The usual filtering of the plating bath should be avoided to prevent removal of purposely added particles. Stirring of the plating bath (44), indicated by (43), serves to keep particulates in suspension as well as providing enhanced mass transport to the growing surface in fixture (41). Typical particle sizes preferably range from the nanoscale, about 0.01 micron, to 100 micron or, more preferably, from 0.1 to 10 micron. Due attention should be given to avoiding possible pyrophoric reaction of finely divided metals.

Particulate materials suspended in the plating solution may be either conducting or non-conducting. Diamond particles co-deposited in a nickel matrix are an example of the uniform incorporation of finely divided non-conducting particles throughout an electrodeposited metal, with a well-known use as rotary saw blades for dicing silicon wafers in semiconductor fabrication. As another example, hard silicon carbide particles can be incorporated in a matrix by plating nickel from sulfamate solution mixed with finely divided silicon carbide particles having a 1.0 micron diameter, as described by Keukelaar and Nanis (U.S. Pat. No. 5,973,405 and U.S. Pat. No. 6,359,337).

Metallic conducting particles may also be co-deposited in a plated pure metal or alloy matrix. As an example, co-deposition of titanium particles suspended in a nickel bath as well as co-deposition of both titanium and aluminum particles in nickel has been described by Budniok et al. (Thin Solid Films, vol; 474, Issues 1-2, March 2005, pp 145-153). The composition of an alloy target comprised of matrix deposit with co-deposited metal powder can be advantageously selected by adjusting the volume percentage of particulate solids suspended in the plating bath. The ability to control alloy composition in a simple manner by adjusting bath composition is a useful feature where mechanical properties of an alloy depend strongly on slight changes in composition, as in the case of nickel-titanium shape memory alloys. Target compositions may be formed which are otherwise difficult or costly to fabricate either by conventional alloy melting or by powder metallurgy methods.

Nickel-silicon alloy serves as an example for comparison of the present invention with currently used methods for sputter target fabrication. Nickel-silicon alloy targets useful in semiconductor technology have been made both by casting ingots from a molten mixture, as described by Ivanov (U.S. Pat. No. 6,780,295), and also by pressing and sintering a mixture of silicon and nickel powders, as described by Yi et al. (U.S. Pat. No. 6,713,391). The present invention is a third method to achieve nickel-silicon alloy compositions, namely by plating nickel from a bath containing a suspension of solid particles of silicon. The feasibility of electrolytic co-deposition of silicon particles in a nickel matrix to form nickel-silicon alloy has been demonstrated by Popczyk et al. [Materials Science Forum, vols 514-516 (2006) pp 1182-1183, TransTech Publications, Switzerland]. Corrosion resistant thin coatings of nickel-silicon alloy were formed at room temperature by electrodeposition from a nickel sulfate bath containing silicon powder of 325 mesh size (0.0017 inch or 0.043 mm). For the purpose of the present invention, with continued deposition, said silicon particles can be incorporated in the co-deposited matrix of said solid nickel grown to a thickness suitable for use as a sputter target The present invention is thus a viable alternative to conventional melting or powder methods of target fabrication.

Mixed powders of electrically conductive pure metals or powders formed from pre-alloyed solids, such as type 304 stainless steel, can be co-deposited with a matrix metal to form a desired alloy composition.

The disclosed technology of electrolytic deposition applied to the fabrication of sputter target materials offers a means to obtain 100 percent dense targets which are firmly bonded in direct contact with a copper backing plate or starting sheet without a conventional low melting solder layer. The disclosed technology affords advantages over powder and casting methods for sputter target fabrication in terms of simplicity of equipment. Targets may be formed in any configuration, including cylindrical shapes for rotating targets designed for improved material utilization. Targets may comprise pure metal or multi-component metal alloys or mixtures of co-deposited particulate materials encapsulated within matrix metals or matrix alloys. Said particulates may be single metal powders, mixtures of metal powders, powdered alloys, powdered intermetallic compounds or powdered non-metals. Other aspects and advantages of the technology described herein are provided with reference to the detailed description and claims which follow.

The invention claimed is:

1. A method for fabricating sputter targets comprising:
providing a sputter target backing plate having a target surface and a back side, and at least one boss away from the target surface, the at least one boss configured to mate in a vacuum seal relationship with a structure for electrical isolation of the target backing plate from a sputter chamber wall, to connect the target backing plate to a source of power for the sputter target, and to confine coolant flow against the back side; and
applying a layer of sputter target material comprising by electrolytically depositing metal-particle composite material on the target surface of the target backing plate.

2. The method of claim 1 where said applying includes electrolytically depositing the layer comprising a metal-particle composite material onto a surface of a metal starting sheet to provide a plated surface on the metal starting sheet, then subsequently solder bonding the metal starting sheet to the target backing plate, whereby the target surface comprises the plated surface of the metal starting sheet.

3. The method of claim 1, including mounting the backing plate or a starting sheet in a fixture during electrolytic deposition, said fixture preventing access of current and electrolytic deposition to regions of the backing plate or starting sheet except to the surface where electrolytic growth of target material occurs.

4. The method of claim 1 where the metal of the metal-particle composite material is an alloy formed by electrolytic reduction and co-deposition of two or more metal components from ions in solution.

5. The method of claim 1 where the metal of the metal-particle composite material is an alloy formed by electrolytic reduction and co-deposition of a non-metal from an ion in solution together with ions of one or more metal components.

6. The method of claim 1 where the metal-particle composite material is an alloy formed by electrolytic reduction of a matrix metal from ions in solution, the matrix encapsulating co-deposited particulate matter suspended in the solution.

7. The method of claim 6 where the matrix metal is an essentially pure metal.

8. The method of claim 6 where the matrix metal is an alloy comprised of two or more metals.

9. The method of claim 6 where the matrix metal is an alloy comprised of one or more metals and one or more non-metals.

10. The method of claim 5 where the co-deposited non-metal comprises at least one of phosphorous and boron.

11. The method of claim 6 where the particulate matter comprises one or more of a group consisting of an essentially pure metal powder and mixtures of metal powders.

12. The method of claim 6 where the particulate matter comprises a powder formed from a pre-mixed metal alloy.

13. The method of claim 6 where the particulate matter comprises one or more of a group consisting of a non-metallic solid, including carbon, silicon, germanium, sulfur, arsenic, selenium, tellurium and boron or mixtures thereof.

14. The method of claim 6 where the particulate matter has an average size ranging from the nanoscale of about 0.01 micron to the microscale of about 100 micron.

15. The method of claim 11 where the essentially pure metal particulate matter comprises one or more of a group consisting of powders of aluminum, titanium, zirconium, molybdenum, tungsten, vanadium, iron, nickel, cobalt, manganese, chromium, rhenium, osmium, iridium, ruthenium, platinum, silver and gold.

16. The method of claim 6 where the particulate matter comprises one or more of a group of chemical compounds or intermetallic compounds, the group consisting of silicon carbide and other carbides, borides, aluminides, silicides, nitrides, oxides, sulfides, arsenides, phosphides, tellurides, selenides and compounds which are combinations thereof.

17. The method of claim 1 where the target surface is non-planar, curved or cylindrical.

18. The method of claim 1 where the target surface of the target backing plate is planar, and said forming includes electrolytically depositing the metal-particle composite material onto the planar surface.

19. The method of claim 6 where the particulate matter comprises a pre-mixed powder formed from iron, nickel and chromium.

20. The method of claim 6 where the particulate matter comprises a pre-mixed powder formed from cobalt and chromium.

21. The method of claim 1, where the metal-particle composite material comprises a matrix copper with co-deposited particulate indium selenide, gallium selenide, and selenium.

22. The method of claim 1, where the metal-particle composite material comprises copper, indium, gallium and selenium.

23. The method of claim 1, where the metal-particle composite material comprises selenium.

24. The method of claim 1, where the metal-particle composite material comprises a selenide.

25. The method of claim 1, where the metal-particle composite material comprises cadmium.

26. The method of claim 1, where the metal-particle composite material comprises tellurium.

* * * * *

UNITED STATES PATENT AND TRADEMARK OFFICE
CERTIFICATE OF CORRECTION

PATENT NO.       : 8,197,661 B1                                   Page 1 of 1
APPLICATION NO.  : 11/945178
DATED            : June 12, 2012
INVENTOR(S)      : Leonard Nanis It is certified that error appears in the above-identified patent and that said Letters Patent is hereby corrected as shown below:

In the Claims

In claim 1, column 11, line 36, delete the word "comprising".

Signed and Sealed this
Twenty-fourth Day of June, 2014

Michelle K. Lee
*Deputy Director of the United States Patent and Trademark Office*